United States Patent [19]

Fuhrman

[11] 4,120,048
[45] Oct. 10, 1978

[54] MEMORY WITH SIMULTANEOUS SEQUENTIAL AND RANDOM ADDRESS MODES

[75] Inventor: James L. Fuhrman, Cedar Rapids, Iowa

[73] Assignee: Rockwell International Corporation, El Segundo, Calif.

[21] Appl. No.: 864,281

[22] Filed: Dec. 27, 1977

[51] Int. Cl.² .............................................. G11C 8/00
[52] U.S. Cl. .................................. 365/239; 364/200; 365/230
[58] Field of Search ................ 364/200, 900 MS File; 365/219, 220, 221, 230, 239

[56] References Cited

U.S. PATENT DOCUMENTS 3,638,204  1/1972  Kolankowsky .................. 365/230

Primary Examiner—Stuart N. Hecker
Attorney, Agent, or Firm—Bruce C. Lutz; Howard R. Greenberg; H. Frederick Hamann

[57] ABSTRACT

This is a consolidated memory element allowing two simultaneously occurring independent accesses to take place. As disclosed, the apparatus contains both a random address mode and a sequential address mode to allow the simultaneous modes of (1) random read/sequential read, (2) random read/sequential write, (3) random write/sequential read.

3 Claims, 3 Drawing Figures

MEMORY WITH SIMULTANEOUS SEQUENTIAL AND RANDOM ADDRESS MODES

SUMMARY OF THE INVENTION

The present invention is generally related to electronics and more specifically to a multiple access memory system. Even more specifically, the present apparatus is related to a memory device useful in various applications in a communication switching system.

In prior art communication switching systems, it has been necessary to design a multiplicity of memory access circuits for various applications within digital time-division multiplexed switching systems and, in fact, in one embodiment of a switch nine different memory access systems were required. The present inventive concept on the other hand, by using three address ports, is able to be used in different modes so as to fulfill the requirements of each of the previously independently designed nine different versions of a memory access sytem.

It is, therefore, an object of the present invention to provide improved memory access apparatus.

Other objects and advantages of the present invention will be apparent from a reading of the specification and appended claims in conjunction with the drawings wherein:

DETAILED DESCRIPTION

Figure 1:
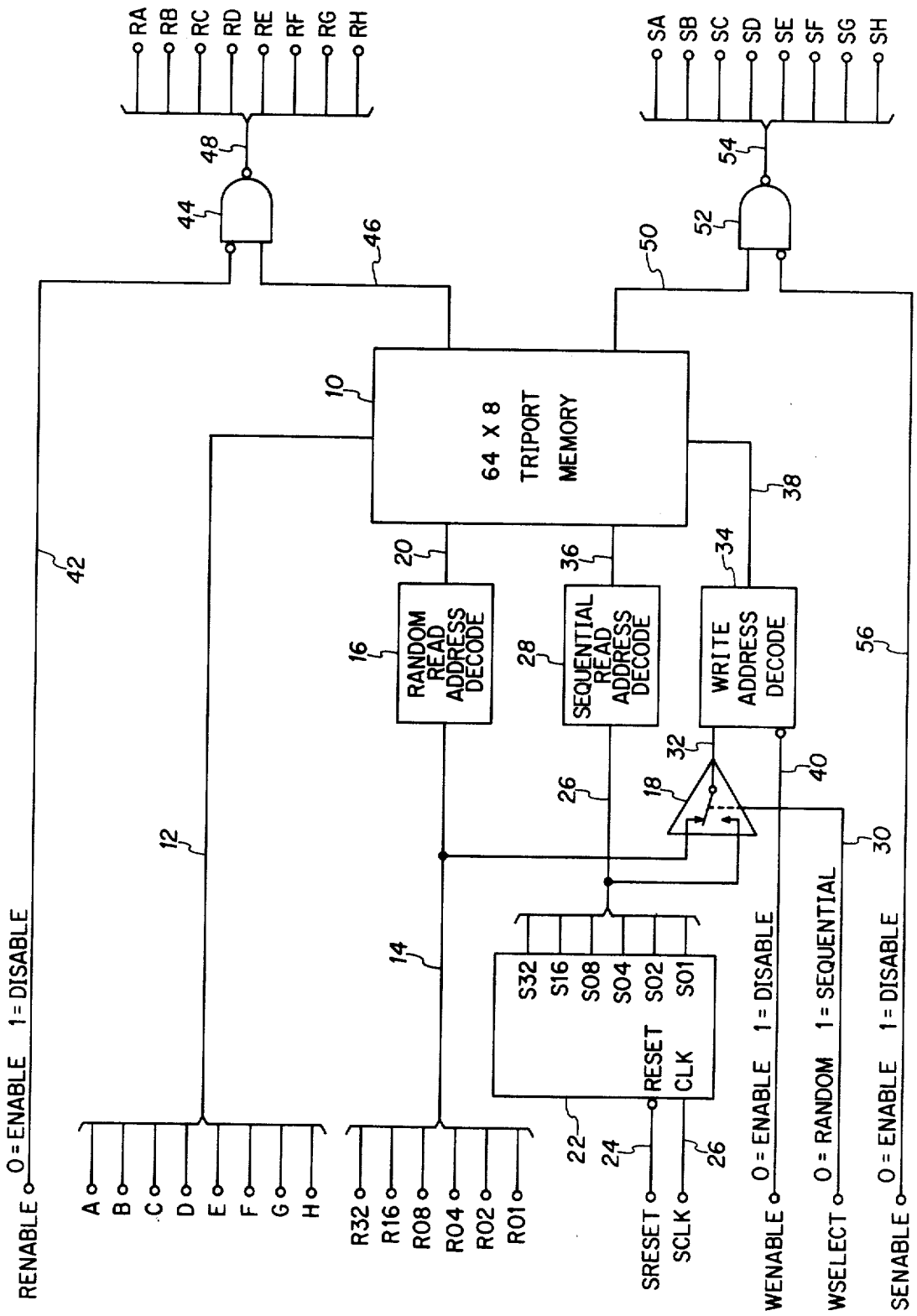
FIG. 1 is a block diagram of the over-all inventive concept.

In FIG. 1, a triport memory 10 labeled as a sixty-four word by eight-bit wide triport memory receives eight bits of parallel data on a line 12 which has terminals A through H. Random address leads R01 through R32 are connected on a set of parallel leads 14 to a random read address decode block 16 and to one input of a multiplexer 18. Random read decode 16 is connected via a plurality of leads 20 to a first address input of memory 10. A counter 22 receives a sequential Reset input signal on lead 24 and a sequential clock signal on lead 26. Counter 22 has six output leads labeled S01 through S32 in binary fashion connected through a plurality of leads 26 to a sequential read address decode block 28 and also to a second input of the multiplexer 18. A Write Select signal is supplied on a lead 30 to initiate the multiplexing action of multiplexer 18 so as to connect one of the two inputs of 18 to an output appearing on a plurality of leads 32 and applied to a write address decode block 34. Sequential read decode block 28 is connected via a plurality of leads 36 to a second address input of memory 10 while write address decode block 34 is connected by a plurality of leads 38 to a final address input of block 10. A Write Enable signal is supplied on a lead 40 and inverted before being applied to select the mode of operation for decode block 34. A Read Enable signal is supplied on a lead 42 to an inverted input of a NAND gate 44 which receives a second input from an output of memory 10 on a plurality of leads 46. The NAND gate 44 is in actuality a plurality of NAND gates and provides eight outputs labeled RA through RH on a plurality of leads 48. Triport memory 10 also supplies a plurality of outputs on lead 50 to a plurality of NAND gates 52 for providing a plurality of outputs on eight leads SA through SH and generally labeled as 54. A Sequential Enable signal is supplied on a lead 56 to an inverted input of each of the NAND gates 52.

Figure 2A:
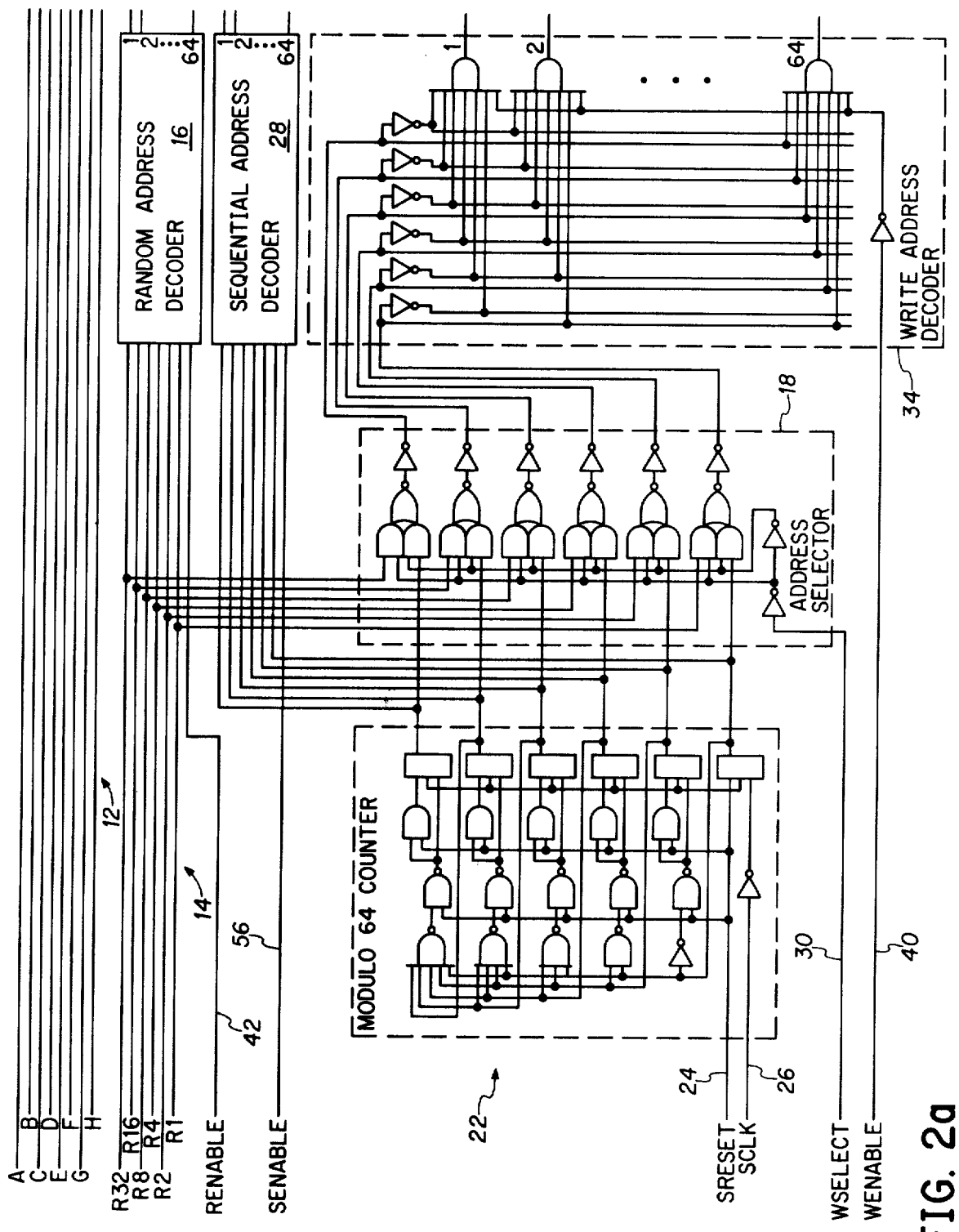
FIGS. 2a and 2b are detailed schematic representations of the contents of the blocks in FIG. 1.
Figure 2B:
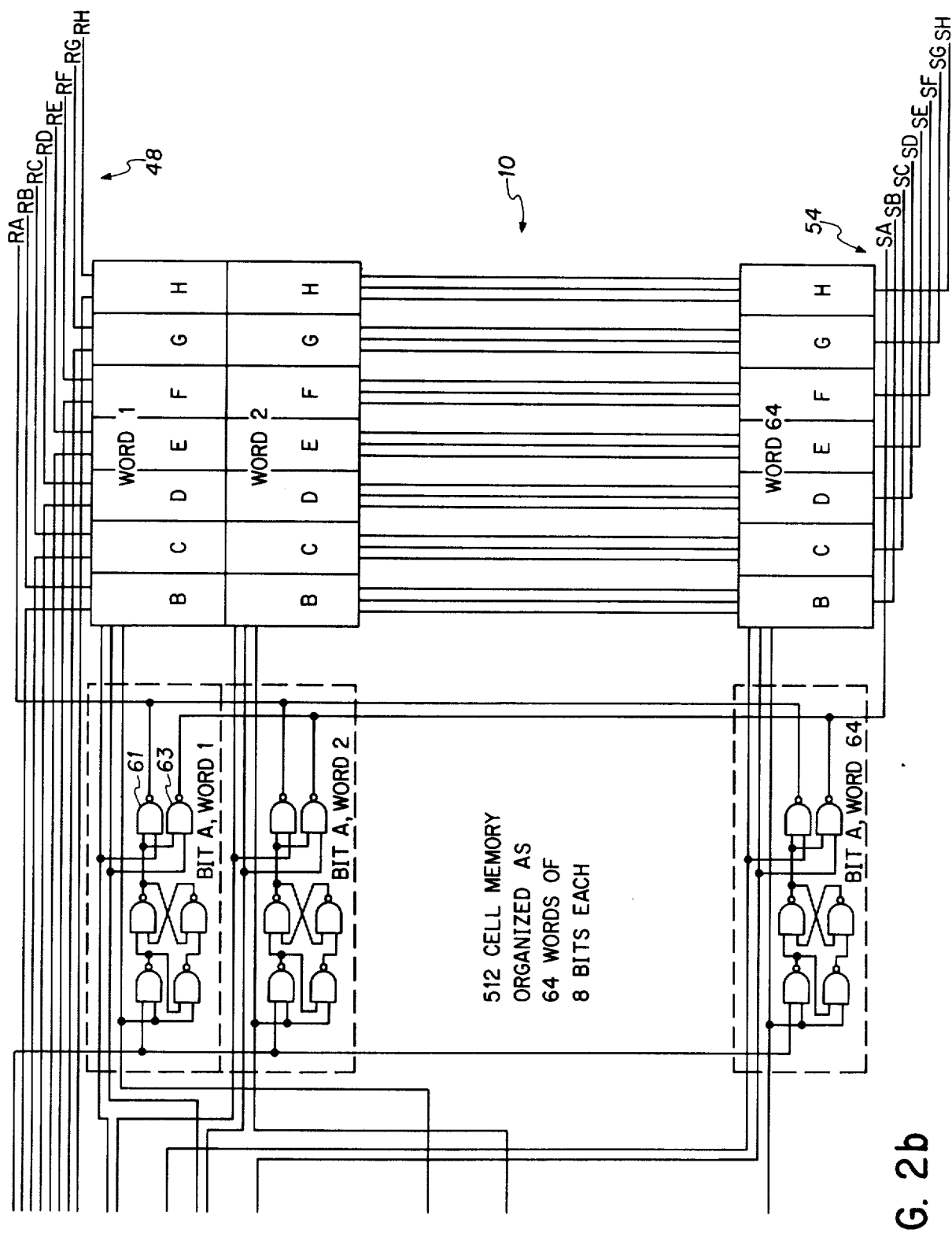

In FIGS. 2a and 2b, the same components are labeled identically as in FIG. 1. As will be noted, counter 22 is a very simple configuration and for the specific circuit illustrated merely comprises a plurality of NAND gates, AND gates, inverters and J-K flip-flops. The address selector is also of fairly straightforward circuit design and comprises a plurality of AND gates, NOR gates and inverters.

The write address decoder is substantially identical in configuration to that of the decoders 16 and 28, and, thus, only the single decoder is illustrated.

Since all the cells of the memory are identical, only three cells are illustrated with the remaining cells being indicated by blocks or leaving space for the insertion of the remaining 61 words. NAND gate 61 is only representative of 44 when word "1" is being addressed and it would not be representative if any other word were being addressed such as word 64. In this case, the upper NAND gate within each of the cells of word 64 is representative of 44.

By observation of the circuit diagram, it will be realized that since there are two outputs connected to the flip-flop in each of the cells, two address operations for reading out data can occur simultaneously without interference with each other. It should also be noted that in one implementation of the present invention each of these NAND gates such as 61 and 63 are designed in the open collector configuration for wired-OR implementation.

OPERATION

As previously indicated, the apparatus illustrated for one specific design provides for two simultaneous, independent accesses to take place at once. The addresses are 6-bits long and can address any one of the 64 words in the memory 10.

The counter 22 provides a cycling set of sequentially occurring address designations so that each successive word in memory is accessed in the read or write mode.

Since there are only two addresses input to the memory, only two operations can occur simultaneously. As designed, it will be noted that the modes permitted are (1) random read/sequential read, (2) random read/sequential write, and (3) random write/sequential read.

Thus, for the first mode, the random signals coming in on line 14 will be decoded by decode block 16 and applied to the memory 10, and, thus, the output, due to the logic zero Enable signal on 42, will proceed through the NAND gates 44 and appear on leads 48. Additionally, the sequential addresses generated by counter 22 will be supplied through leads 26 and decoded by block 28 so as to provide output signals from memory 10 on lead 50, and, thus, due to a logic zero on lead 56, these signals or words will appear on output leads 54.

For mode 2, the read signals will still be supplied on the lead 14 but the signals from counter 22 will be applied through multiplexer 18 due to a logic one appearing on lead 30 and will be decoded by block 34 due to a logic zero on lead 40. These addresses will then be applied to the memory 10 for writing data in a sequential manner as it appears on the plurality of leads 12.

In the third mode of operation, the random address signals appearing on lead 14 will be used to write data being applied on leads 12 to memory 10 while the sequential signals from counter 22 are applied through decoding block 28 to the memory so as to provide outputs on leads 54 due to a logic zero appearing on lead 56.

In one embodiment of a time-space-time switch, this triport memory apparatus is used at the data input in a sequential write/random read condition for providing the time multiplexing operation. The random read address input is generated by a similar device which is normally in the sequential read condition. This condition occurs about 99% of the time. However, on occasion when the device is changing state it reverts to a sequential read/random write condition and on other occasions when it is verifying a state it is in a sequential read/random read condition. A conferencing section of this time-space-time switch uses one of these memory devices normally in a random read/sequential read condition, but on occasion the device must be in a random write/sequential read condition. Finally, the last stage of the time-space-time switch for outputting data is normally in a random write/sequential read condition with the address inputs being supplied by the three-state device previously mentioned in conjunction with the first stage of the time-space-time switch.

Thus, it is necessary that the apparatus not only work in any one of the three modes, but, in addition, it must be alterable between the various modes for some positions within the switch. The versatility of the present device renders it far superior to prior art memory devices and although a specific embodiment has been illustrated for purposes of explanation of the inventive concept, it is to be understood that the invention is of considerable import and is to be limited only by the scope of the appended claims.

What is claimed is:

1. Multiple access memory apparatus comprising, in combination:
   cell memory means including data input means, random access output means, sequential access output means, random read input means, sequential read input means, and write input means;
   data source means connected to said data input means of said cell memory means for supplying data bits thereto;
   sequential address signal supply means;
   random address signal supply means; and
   control means connected to said cell memory means, said sequential address signal supply means and said random address signal supply means for providing one of simultaneous operation modes of (1) random read/sequential read, (2) random read/sequential write and (3) random write/sequential read.

2. The method of accessing a memory for two simultaneous operations in one of three possible modes of (1) sequential read/random read, (2) sequential write/random read, and (3) random write/sequential read comprising, the steps of:
   supplying sequential count first signals;
   decoding said first signals to provide second signals;
   supplying random address third signals;
   decoding said third signals to provide fourth signals;
   accessing a three-port memory with said second and fourth signals for independent read operations; and
   selectively decoding said first and third signals to provide fifth signals for data write operations in said three-port memory.

3. Apparatus for accessing a memory for two simultaneous operations in one of three possible modes of (1) sequential read/random read, (2) sequential write/random read, and (3) random write/sequential read comprising, in combination:
   memory means;
   first means for supplying sequential count first signals;
   second means connected to said first means for decoding said first signals to provide second signals;
   third means for supplying random address third signals;
   fourth means connected to said third means for decoding said third signals to provide fourth signals;
   fifth means connected to said memory means, said second means and said fourth means for accessing said memory means with said second and fourth signals for independent read operations; and
   sixth means connected to said memory means, said first means and said third means for selectively decoding said first and third signals to provide fifth signals to said memory means for data write operations.

* * * * *